United States Patent [19]

Takani

[11] Patent Number: 5,627,473

[45] Date of Patent: May 6, 1997

[54] CONNECTOR INSPECTION DEVICE

[75] Inventor: Atsushi Takani, Yokkaichi, Japan

[73] Assignee: Sumitomo Wiring Systems, Ltd., Japan

[21] Appl. No.: 428,579

[22] Filed: Apr. 25, 1995

[30]    Foreign Application Priority Data

Jun. 10, 1994   [JP]   Japan .................................. 6-152974

[51] Int. Cl.⁶ ...................................................... H01H 31/04
[52] U.S. Cl. ............................................................ 324/538
[58] Field of Search ...................................... 324/538, 537, 324/539, 540, 541, 542, 543, 544, 158.1

[56]               References Cited

U.S. PATENT DOCUMENTS 4,658,212   4/1987   Ozawa .............................. 324/158 F Primary Examiner—Sandra L. O'Shea
Assistant Examiner—Roger Phillips
Attorney, Agent, or Firm—Bierman and Muserlian

[57]                ABSTRACT

An inspection device for determining the integrity of electrical circuits in a connector having one or more electrical terminals therein. The test device carries probes, corresponding in number and location to the terminals, and the probes and the terminals are at an angle to each other so that, when in test position, the tips of the probes contact a portion of the terminals other than that at which a mating connector would be inserted. This eliminates the possibility of distortion or wear on fragile connecting surfaces.

11 Claims, 3 Drawing Sheets

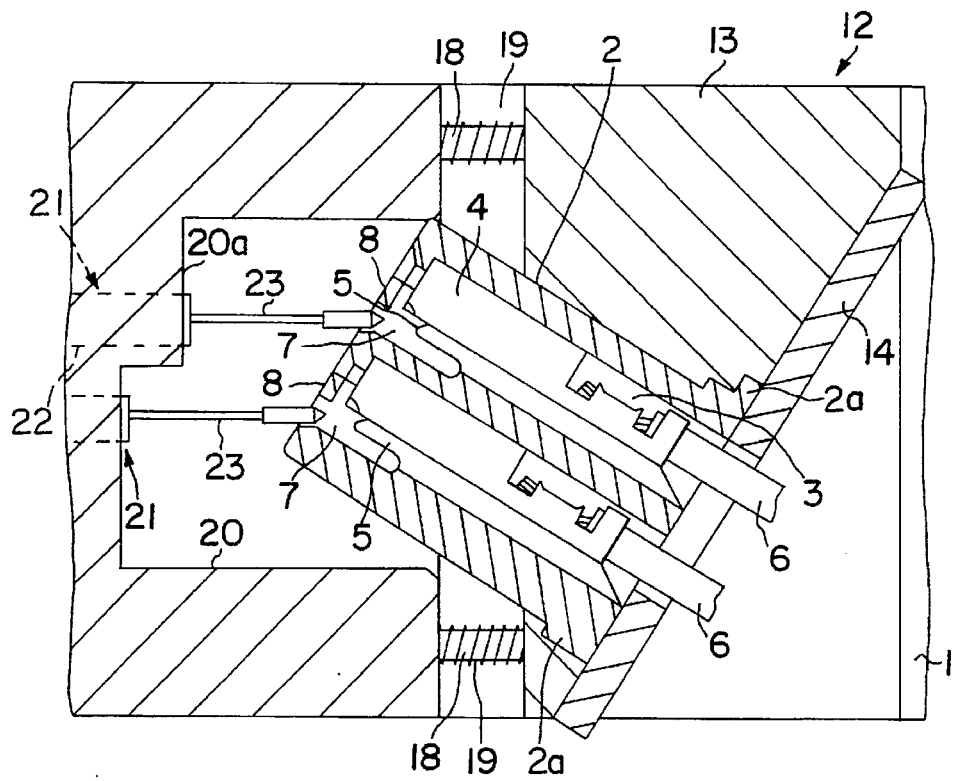
F I G. 3
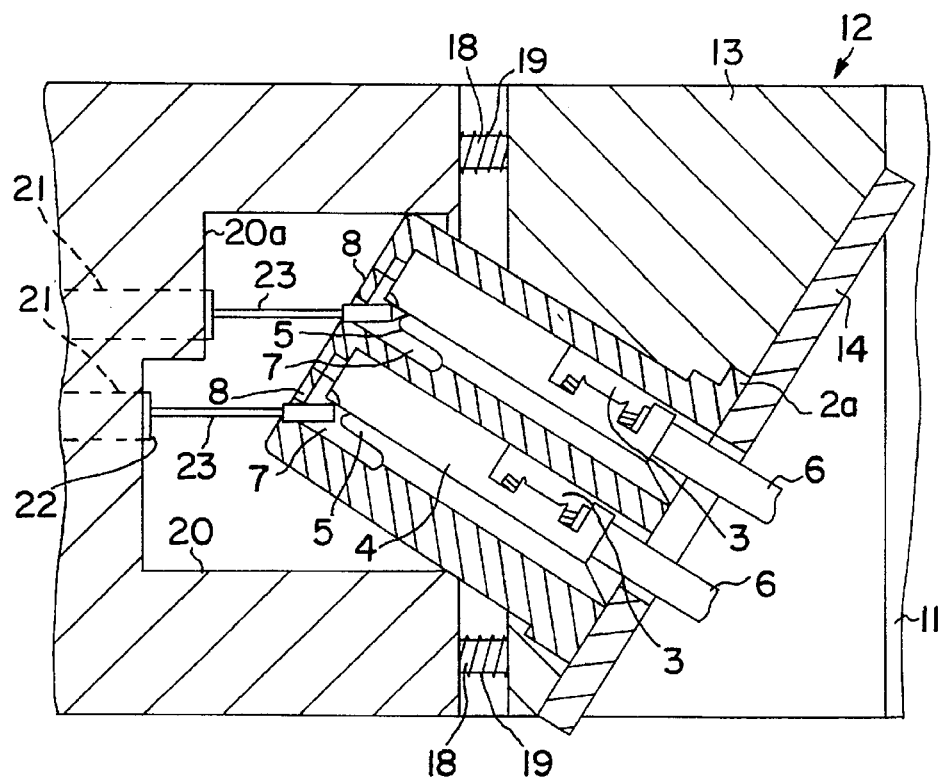
F I G. 4

CONNECTOR INSPECTION DEVICE

This Application claims the benefit of the priority of Japanese 6-152974, filed Jun. 10, 1994.

The present Invention is directed to a device for inspecting a connector in which female terminals are inserted. It indicates the presence or absence of electrical continuity between the terminals and the probes.

BACKGROUND OF THE INVENTION

In Japanese Patent Publication 40669/92, a device is described wherein the base is provided with a connector holder fixed thereto, and a probe holder movable toward and away from the connector holder is slidably mounted on the base. The probe holder is provided with a plurality of probes. In operation, the connector is placed in the connector holder and the probe holder is moved toward the connector holder so that the probes enter into the cavity thereof and contact the terminals mounted inside. If the terminals are properly and correctly inserted in their respective cavities, a complete electrical circuit is formed and the device can so indicate. Alternatively, if the insertion is not correct, there is no complete circuit and the indicator is inoperative. From this, the integrity of the connector can be tested.

However, the foregoing device suffers from a certain disadvantage. The terminals are fitted with tongues which are intended to contact the male terminal to complete the connection. In the foregoing prior art device, the tips of the probes come into direct contact with the tongues, which are usually gold plated to insure good electrical contact. As a result of this construction, there are cases wherein the insertion of the probe damages the plated portion of the tongue, thereby impeding the formation of reliable electrical contacts between the female terminals and the male terminals mating therewith.

SUMMARY OF THE INVENTION

The present Invention is intended to eliminate the aforementioned drawback. It is the object of the present Invention to provide an inspection device which, when the probes are used to determine and indicate the accuracy and correctness of the electrical circuits, will not damage the sensitive tongues.

One type of connector which is inspected by the device of the present Invention comprises a housing containing at least one cavity therein. A terminal is inserted in each cavity and a flexible lance, affixed to the housing, extends therein. As the terminal enters the cavity, it bends the lance into an adjacent space. Once the terminals are in place, it is desired to verify the continuity of the various electrical circuits formed thereby. The present Invention is a device for doing so.

The Invention comprises a connector holder and a probe holder, both of which are mounted on a base and are adapted for movement between a separated position, wherein the probe holder is spaced apart from the connector holder, and a test position, wherein the probe holder and connector holder are sufficiently close together so that the probes and the terminal fittings contact one another. The manner of accomplishing this is not critical, either one may be fixed with the other movable, or both may be movable. The operation can even be carried out manually, although this is not preferred.

In operation, the holders are in their separated position; the connector to be tested is placed on the connector holder so that the axes of the terminals are oblique to the axes of the probes. The holders are then brought to their test position and the probes enter the space adjacent the terminals into which the lances have now been urged. As a result, the probes enter the adjacent spaces and contact the sides of the respective terminals.

The terminals are fitted with tongues intended to mate with corresponding male terminals. Frequently, these tongues are gold plated to insure good electrical contact. However, these tongues are relatively fragile and there is a substantial danger that the act of testing the terminals may damage the tongues and thereby render the connector at least partially inoperable.

It is a feature of the present Invention that the contact between the probes and the terminals is at the side of the latter, rather than, as is the case with the prior art, at the mating surfaces thereof. Thus, the present Invention eliminates the risk of such damage, yet provides reliable test results.

BRIEF DESCRIPTION OF THE DRAWINGS

In the accompanying drawings, in which like reference characters indicate like parts.

FIG. 3 is an enlarged cross section showing the probes as they are about to enter the adjacent space; and FIG. 4 is a view, similar to that of FIG. 3, wherein the probes are in the test position.

DETAILED DESCRIPTION OF THE INVENTION

Figure 1:
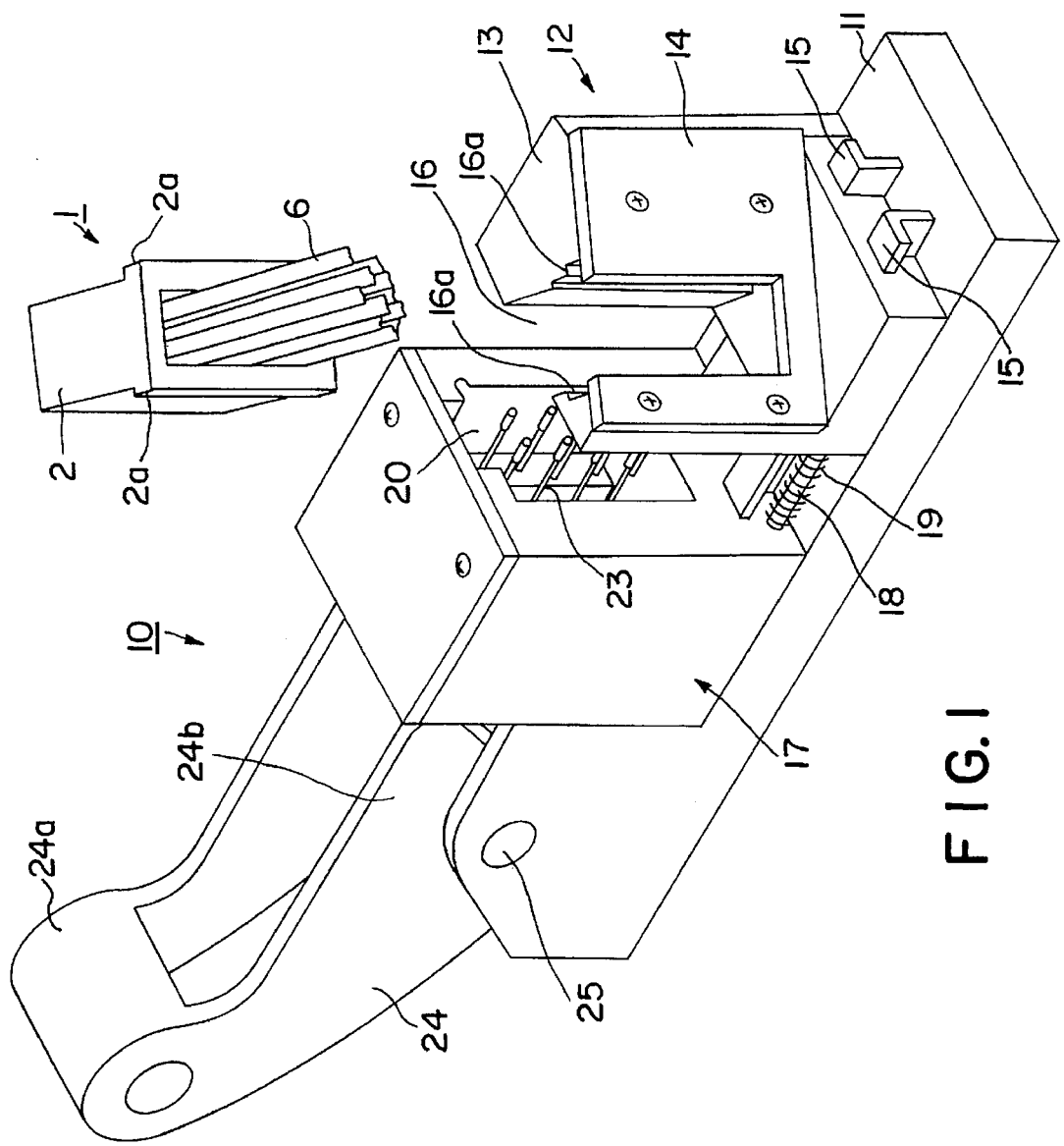
FIG. 1 is a perspective view of the inspection device of the present Invention, including the connector.
Figure 2:
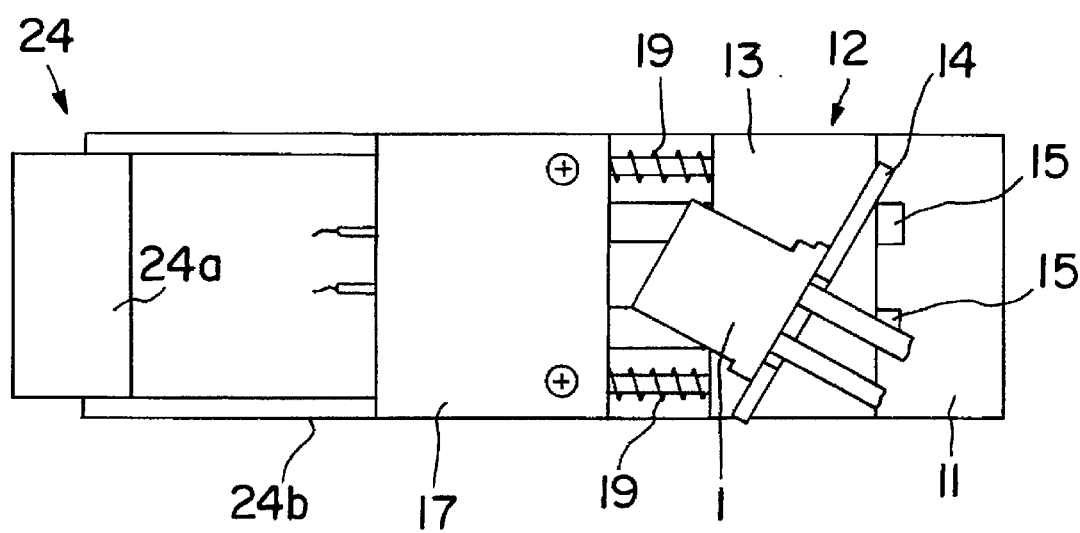
FIG. 2 is a schematic plan view of the device of FIG. 1.

Connector 1, which is to be tested by inspection device 10, comprises housing 2, of insulating material, having a plurality of cavities 3 located therein. Ribs 2a are adjacent the rear thereof and a terminal 4 is placed in each of cavities 3. Lances 5 are affixed to housing 2 and, in their unrestrained positions, extend into cavities 3. When terminals 4 are inserted, lances 5 are pressed into space 7 adjacent thereto. As a result, lances 5 bear against terminals 4 and assist in retaining them within cavities 3. Conductors 6 are attached to the rear of terminals 4. Frame 8 is on the front of connector 2 and divides each cavity 3 from its corresponding space 7. A tongue (not shown) is formed on each terminal 4 for mating with a corresponding terminal (also not shown). The tongue may be gold plated for improved electrical contact.

Inspection device 10 of the present Invention comprises connector retainer 12 and probe holder 17 mounted on base 11. Connector retainer 12 is fixed and probe holder 17 moves on rails 15 between a separated position and a test position. Holder body 13 is provided with keeper 16 which comprises stop plate 14, with a U-shaped opening therein, and grooves 16a adjacent thereto. Guide shafts 18 are provided with springs 19 whereby, when probe holder 17 is in the test position, it is urged toward the separated position.

Probe holder 17 contains probe pins 23 which correspond to cavities 3 and terminals 4 of connector 2. The distance between the side walls of holder body 13 is approximately the same as the width of connector housing 2. Similarly, the distance between the bottoms of grooves 16a is substantially the same as the width of ribs 2a of connector 1.

Ribs 2a of connector 1 are inserted into grooves 16a from above. As can be seen in FIG. 1, the axes of terminals 4 will then be oblique to the axes of probe pins 23. Stop plate 14, cooperating with grooves 16a, serves to retain connector 1 in connector retainer 12.

Referring to FIGS. 3 and 4, probe holder 17 is moved into the test position. Probes 21 are located in recess 20 having stepped portion 20a. In FIG. 3, the tips of probes 23 are shown just as they enter spaces 7 and before contacting terminals 4. In FIG. 4, probe holder 17 and connector retainer 12 are in the test position and the tips of probes 23 contact the sides of terminals 4. This completes the circuit without risk of damaging the contact tongues, even if they are gold plated.

Advantageously, probes 21 are mounted in sleeves 22. It is desirable to have coil springs (not shown) in sleeve 22 urging pins 23 toward connector retainer 12. When in the test position, inspection device 10 is adapted to indicate the presence or absence of a complete circuit. In the former case, the connector is passed as being satisfactory and, in the latter case, it is rejected.

As shown in FIG. 1, device 10 is provided with cam handle 24 having grip 24a and cam 24b. Handle 24 pivots around supporting shaft 25. Thus, by movement of grip 24a and handle 24, cam 24b moves probe holder 17 from its separated position to and from its test position. Thus, moving grip 24a upward (as shown in FIG. 1) causes it to rotate about shaft 25 and cam 24b to bear against probe holder 17. This moves it to the right into the test position.

Because probe pins 23 contact terminals 4 at their sides, rather than at their mating portions, there is no opportunity for probes 21 to damage the (gold plated) contact tongues. At the same time, device 10 provides a reliable test of the integrity of the electrical circuits and terminals 4 involved. In the prior art devices, there is a danger that the probes will contact the tongues forcefully and thereby deform them. Since the probe pins of the present Invention do not contact the tongues, there is no possibility of deformation. Similarly, should the prior art probe pins be deformed, this will also damage the tongues. On the other hand, the device of the present Invention presents no possibility of doing so, even if the pins are badly bent. There is no opportunity for damaging the plating or the tongues when the present Invention is used.

Moreover, the inventive device is quite simple in its operation. It is only necessary to set the connector ribs in the corresponding grooves in the connector retainer and move the cam handle upwardly as shown in FIG. 1. This moves the probe holder into test position and the probe pins themselves contact the sides of the terminals directly. There is no real possibility of damage and the results are reliable and satisfactory.

The present Invention is not limited to the particular embodiment which has been expressly set forth. Such changes and variations as would be apparent to the person of ordinary skill are contemplated as being within the scope thereof. For example, movement of the cam handle can cause both the probe holder and the connector retainer to move toward and away from each other. Alternatively, the probe holder can be fixed and the connector retainer moved by the cam handle. The present Invention requires only that the axes of the terminals be oblique to those of the probe pins when the device is in the test position. This permits contact at the sides of the terminals and protects the contact tongues.

Moreover, the specific shape of the probe pins is not critical. It is only necessary that they be capable of making side contact with the terminals. They can, for example, be band shaped rather than the cylindrical shape as shown herein. In this case, it is preferred that the tip thereof be bent laterally to provide a broader area for contact with the terminals.

Although only a limited number of specific embodiment of the present Invention have been expressly disclosed, it is, nonetheless, to be broadly construed and not to be limited except by the character of the claims appended hereto.

I claim:

1. An inspection device for a connector wherein said connector comprises a housing containing at least one cavity, an electrical terminal in said cavity, and an electrical conductor connected to a rear end of said terminal, said terminal having, on a front end remote from said rear end, an element for electrically contacting a mating contact, said inspection device comprising a connector retainer, adapted to removably retain said connector, and a probe holder containing at least one probe corresponding to said terminal, said retainer and said holder having a separated position, wherein said probe and said terminal are out of contact, and a test position, wherein said probe contacts said terminal other than at said element, thereby forming an electrical circuit with electrical current flowing therein;

said terminal having a first longitudinal axis, said probe having a second longitudinal axis, said first axis and said second axis intersecting each other at an angle greater than 0° and less than 90°.

2. The device of claim 1 wherein said retainer and said holder are mounted on a base, said base comprising at least one rail upon which at least one of said retainer and said holder is adapted to slide.

3. The device of claim 2 wherein there are two said rails.

4. The device of claim 1 wherein said retainer and said holder are mounted on a base, a mechanism for moving said retainer and said holder between said separated position and said test position.

5. The device of claim 4 wherein said mechanism comprises a cam handle pivotally mounted on a support shaft, a cam operatively connected to said handle whereby rotation of said handle about said support shaft moves said retainer and said holder between said separated position and said test position.

6. The device of claim 1 wherein said retainer has a U-shaped opening to receive said connector.

7. The device of claim 1 wherein there is a plurality of terminals.

8. An inspection device for a connector wherein said connector comprises a housing containing at least one cavity, an electrical terminal in said cavity, and an electrical conductor connected to a rear end of said terminal, said terminal having, on a front end remote from said rear end, an element for electrically contacting a mating contact, said inspection device comprising a connector retainer, adapted to removably retain said connector, and a probe holder containing at least one probe corresponding to said terminal, said retainer and said holder having a separated position, wherein said probe and said terminal are out of contact, and a test position, wherein said probe contacts said terminal other than at said element, there being at least one guide shaft upon which said retainer and said holder slide, a coil spring on said guide shaft urging said retainer and said holder toward said separated position.

9. An inspection device for a connector wherein said connector comprises a housing containing at least one cavity, an electrical terminal in said cavity, and an electrical conductor connected to a rear end of said terminal, said terminal having, on a front end remote from said rear end, an element for electrically contacting a mating contact, said inspection device comprising a connector retainer, adapted to removably retain said connector, and a probe holder containing at least one probe corresponding to said terminal, said retainer and said holder having a separated position, wherein said probe and said terminal are out of contact, and a test position, wherein said probe contacts said terminal other than at said element, opposite sides of said opening being provided with grooves, there being ribs on said housing complementary to said grooves.

10. An inspection device for a connector wherein said connector comprises a housing containing at least one cavity, an electrical terminal in said cavity, and an electrical conductor connected to a rear end of said terminal, said terminal having, on a front end remote from said rear end, an element for electrically contacting a mating contact, said inspection device comprising a connector retainer, adapted to removably retain said connector, and a probe holder containing at least one probe corresponding to said terminal, said retainer and said holder having a separated position, wherein said probe and said terminal are out of contact, and a test position, wherein said probe contacts said terminal other than at said element, said cavity being provided with a flexible lance, mounted on said housing, and projecting into said cavity when said terminal is not in said cavity, and being forced into an adjacent space when said terminal is introduced into said cavity, whereby said lance bears against said terminal and assists in retaining said terminal in said cavity.

11. The inspection device of claim 1 wherein a signal is included in said circuit and is actuated by said current.

* * * * *